(12) United States Patent
Matejka

(10) Patent No.: US 9,207,544 B2
(45) Date of Patent: Dec. 8, 2015

(54) METHOD FOR SIMULATING AN AERIAL IMAGE

(75) Inventor: Ulrich Matejka, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 509 days.

(21) Appl. No.: 13/495,490

(22) Filed: Jun. 13, 2012

(65) Prior Publication Data

US 2012/0320183 A1 Dec. 20, 2012

Related U.S. Application Data

(60) Provisional application No. 61/496,738, filed on Jun. 14, 2011.

(51) Int. Cl.
*G03F 1/36* (2012.01)
*G03B 27/54* (2006.01)
*G03F 7/20* (2006.01)

(52) U.S. Cl.
CPC ...................................... *G03F 7/705* (2013.01)

(58) Field of Classification Search
None
See application file for complete search history.

(56) References Cited

U.S. PATENT DOCUMENTS

| | | | | |
|---|---|---|---|---|
| 6,839,125 | B2* | 1/2005 | Hansen | 355/67 |
| 7,528,934 | B2* | 5/2009 | Hansen | 355/55 |
| 7,684,013 | B2* | 3/2010 | Hansen et al. | 355/67 |
| 2004/0156029 | A1 | 8/2004 | Hansen | 355/67 |
| 2007/0002300 | A1 | 1/2007 | Hansen et al. | 355/67 |
| 2008/0158529 | A1* | 7/2008 | Hansen | 355/53 |
| 2008/0186468 | A1* | 8/2008 | Hansen et al. | 355/67 |
| 2009/0231562 | A1* | 9/2009 | Yoshii et al. | 355/53 |
| 2009/0305172 | A1* | 12/2009 | Tanaka et al. | 430/323 |
| 2010/0149505 | A1* | 6/2010 | Sewell et al. | 355/67 |
| 2010/0175043 | A1* | 7/2010 | Mukherjee et al. | 716/21 |
| 2011/0090329 | A1* | 4/2011 | Poortinga et al. | 348/79 |
| 2011/0116067 | A1* | 5/2011 | Ye et al. | 355/67 |

FOREIGN PATENT DOCUMENTS

DE 10 2009 041 405 3/2011 ............. G02B 21/06

OTHER PUBLICATIONS

Hopkins, "On the Diffraction Theory of Optical Images,"Proceedings of the Royal Society of London, Series A, Mathematical, Physical & Engineering Sciences, 217:408-432, 1953.
Totzeck, "Numerical Simulation of High-NA Quantitative Polarization Microscopy and Corresponding Near-fields," Optik 112, No. 9, pp. 399-406, 2001.

* cited by examiner

*Primary Examiner* — Jay Patel
*Assistant Examiner* — Reza Aghevli
(74) *Attorney, Agent, or Firm* — Fish & Richardson P.C.

(57) ABSTRACT

An aerial image is generated by imaging an object with the use of an imaging optic, the object being illuminated by an illuminating optic by using a light source emitting illuminating radiation, the illuminating optic having a pupil plane. A first data set is defined to represent the object, a second data set is defined to represent the intensity distribution of the illuminating radiation in the pupil plane of the light source, and the aerial image is calculated from the first and the second data set, in which the resolution of the second data set varies according to the intensity or according to the location of the pupil plane. A microscope includes an imaging optic for imaging an object, a detector for capturing an aerial image of the object, and a processing unit for simulating aerial images generated by the microscope.

38 Claims, 5 Drawing Sheets

METHOD FOR SIMULATING AN AERIAL IMAGE

CROSS REFERENCE TO RELATED APPLICATIONS

This application claims priority to U.S. provisional application 61/496,738, filed on Jun. 14, 2011. The above application is incorporated by reference.

TECHNICAL FIELD

This patent specification is directed to a method for simulating an aerial image and a microscope having a processing unit for carrying out the method.

DESCRIPTION

Methods for simulating aerial images are being used with ever-increasing frequency in, for example, lithography for the production of semiconductor components. In lithography, the features of masks, which are also referred to synonymously as reticles, are projected by means of scanners or steppers onto wafers coated with a light-sensitive layer, the resist. Masks can be implemented, for example, as "binary masks," with chromium features on quartz glass, or as phase-shift masks. For EUV lithography applications, reflective masks are used. To enhance resolution in the imaging of features, the illumination is performed with special so-called "illumination settings," also referred to merely as "settings." For this purpose, intensity distributions created by using special optical elements or special diaphragms are produced in the pupil plane of the illumination optic used.

The masks are inspected with specially designed microscopes. Mask inspection microscopes, such as the AIMS microscope system available from Carl Zeiss SMS GmbH, are used to determine whether or not existing defects will have negative effects during the exposure of the wafer. These microscopes are equipped with imaging optics and light sources that permit imaging that mimics the behavior of the scanner as closely as possible. Position measuring devices, such as the PROVE system available from Carl Zeiss SMS GmbH, are used to determine the positions of features on masks with high accuracy. These microscopes are provided with a sample holder that can be positioned with high accuracy, providing mask positioning to an accuracy of less than 1 nm.

In microscopes of this kind, the structure of a mask is projected onto a light-sensitive spatially resolved detector, such as, for example, a CCD (charge coupled device) chip.

To perform an inspection, the masks are compared with the feature specifications, which are in the form of a data set known as the mask design. Since the feature specifications of the mask and a corresponding aerial image will differ from each other due to the imaging process, an aerial image simulated from the corresponding mask design is used as the comparison reference for the captured aerial image. Owing to the ever-smaller features being patterned on masks and the higher requirements placed on feature position determination, increasingly accurate methods must be used for aerial image simulation.

Simulating aerial images requires high computational effort, however, which is very time-consuming in practice. One of the features of the invention is, therefore, to provide a method for simulating aerial images that requires little computational effort but provides high accuracy.

A method is provided for simulating an aerial image generated by imaging an object with the use of an imaging optic, the object being illuminated by using a light source emitting an illuminating radiation, the light source having a pupil plane. The method includes defining a first data set to represent the object, defining a second data set to represent the intensity distribution of the illuminating radiation in the pupil plane of the light source, and calculating the aerial image from the first and the second data set, in which the resolution of the second data set varies according to the intensity or according to the location of the pupil plane.

To simulate an aerial image, for each to-be-calculated image dot, i.e. pixel, of the aerial image, a summation is performed across all the image dots, i.e. pixels, of the second data set (of the pupil plane). Thus, the smaller the number of pixels in the second data set, the less the computational effort. "Resolution" here means the number of image dots or pixels per unit area. Varying the resolution of the second data set according to the intensity or the location of the pupil plane means that the resolution varies either according to the location or the intensity or according to the location and the intensity simultaneously.

This measure has the advantage of reducing the number of computation steps but only slightly decreasing the accuracy of the simulation.

In lithographic applications, the first data set represents, for example, the mask design or (for more accurate simulations) the three-dimensional structure of a mask. The other parameters of the imaging optic used, the light source, etc., correspond to the microscope used, for example a mask inspection microscope or a position measuring device or scanner.

In a further embodiment of the invention, the second data set has a higher resolution in regions of high intensities than in regions of low intensities.

Pixels in the second data set that have high intensity contribute more to the result of the simulation than low-intensity pixels. Consequently, according to the invention the resolution of the second data set is higher at the locations that also make a high contribution during simulation.

In a further embodiment of the invention, the resolution of the second data set is higher in the edge region of the pupil than at its center.

In the illumination settings commonly used in microscopy, the intensities in the edge region are often higher or vary more sharply than at the center region. These regions thus make a higher contribution to the simulation of the aerial image. This measure, therefore, further minimizes the computational effort while preserving high accuracy.

In a further embodiment of the invention, the second data set is determined from a first matrix of intensities having constant resolution by combining adjacent pixels, according to their intensity or their location, to form superpixels, also referred to as supra-pixels.

This measure has the advantage that the inventive method can also be used when the intensity distribution in the pupil plane is available only with constant resolution. This is the case, for example, when the intensity distribution has been captured with a microscope. For this purpose, a Bertrand lens is moved into the beam path and the aerial image of the pupil plane is captured with a detector. Since the detector will usually have constant resolution, a first matrix of intensities having constant resolution is calculated as a result.

In a variant of this measure, intensities of pixels combined into superpixels are subtracted from the intensities in the first matrix.

In a further embodiment of the invention, in determining the second data set, the resolution is increased from the center of the pupil to the edge.

As explained with regard to the previous measure, it can be advantageous for the resolution of the second data set to be higher in the edge region of the pupil than at its center. It can therefore be advantageous to increase the resolution of the second data set in the edge region to a greater extent than would be possible if the increase were to depend on the intensity alone.

According to this measure, for example before the second data set is calculated and before a determination is made as to whether combination into superpixels should be performed, the intensities of the first matrix are weighted by a weighting function that causes the intensities to increase from the center of the pupil to the edge. The intensities themselves that are then combined into superpixels are not changed.

In a further embodiment of the invention, the superpixels are formed iteratively, wherein with each iteration the size of the superpixels to be formed increases and the intensity of the superpixels to be formed decreases.

This measure has the advantage that due to the formation of superpixels in regions of high intensities, the resolution of the second data set remains high, since small superpixels bring about high resolution.

In the application of this measure, for example a threshold value limit is set. Pixels of the first matrix are combined into superpixels if their sum exceeds this threshold value limit. In a variant, the threshold value can be changed in each iteration, for example by multiplying it by a factor Fa. The nature of the change is that the threshold value is made smaller by multiplication.

In a further embodiment of the invention, pixels whose intensities are greater than a specified value are not combined into superpixels.

This measure has the advantage that in regions of high intensities, the high resolution of the first matrix is preserved in the second data set.

In a further embodiment of the invention, the area of a superpixel is determined from the sum of the areas of the combined pixels, and the intensity of a superpixel is determined from the sum of the intensities of the combined pixels.

This measure has the advantage that superpixels can be defined in a simple manner. The total intensity, i.e., the sum of the intensities of all the pixels, of the first matrix is not changed and is identical to the total intensity of the second data set.

In a further embodiment of the invention, the location of a superpixel is defined by calculating the center of the area or the centroid of the area based on the intensities of the combined pixels.

Calculating the center as the location of a superpixel has the advantage that the center is easy to calculate.

This special embodiment and arrangement of the superpixels has the advantage that the center of each superpixel coincides with a pixel of the original matrix $S_M$. This pixel can be assigned the intensity of the superpixel. In simpler arrangements, for example if a superpixel is simply a combination of 2×2 pixels, this would not be the case. The intensity centroid would be shifted, thus lowering the accuracy of the simulation.

In a further embodiment of the invention, the superpixels are disposed symmetrically to the center of the pupil plane of the light source.

The center of the pupil plane lies on the optical axis of an imaging optic of the microscope whose imaging behavior is to be simulated. Since illumination settings that are symmetrical to the optical axis are commonly used in microscopy, the second data set is usually symmetrical to the center of the pupil. The inventive arrangement of the superpixels ensures that the second data set, when determined from the first matrix, will be symmetrical with respect to the center of the pupil. This eliminates rounding errors during conversion.

In a further embodiment of the invention, superpixels are formed from 2, 4, 8, 16, 32 or 64 pixels.

In a further embodiment of the invention, the superpixels are shaped as square.

Both of the above measures have the advantage that pixels possessing high symmetry are formed. These are easy to arrange symmetrically with respect to the center of the pupil. In the iterative method for generating superpixels, this results in an advantageous intensity distribution.

The superpixels can be arranged in the first matrix in such a way that the center of a superpixel or a corner of a superpixel coincides with the center of a pixel of the first matrix.

In a further embodiment of the invention, the edges of the superpixels are arranged parallel or diagonal to the pixels of the first matrix.

This measure has the advantage that the corresponding superpixels can be arranged symmetrically to the center of the pupil.

The invention is also directed to a microscope comprising an imaging optic for imaging an object, a light source having a pupil plane, a detector for capturing an aerial image of the object, a processing unit for carrying out the method described here, in which aerial images from the imaging process are simulated by using this microscope.

This measure has the advantage that the necessary aerial images are quickly and easily accessible. The characteristics of the imaging optic and the light source and, as appropriate, any additional characteristics of the microscope are used in the simulation.

In a further embodiment of the microscope, the latter has a Bertrand lens that can be moved into the beam path of the imaging optic to capture an aerial image of the pupil plane by using the detector, the aerial image being supplied as a first matrix of intensities having constant resolution.

This measure has the advantage that the second data set can be determined quickly and easily with high accuracy.

It is understood that the features of the invention cited heretofore and explained in more detail below can be used not only in the described combinations, but also in other combinations, without departing from the scope of the present invention.

The invention will be described and explained in more detail below on the basis of a few selected exemplary embodiments with reference to the drawings.

Figure 1:
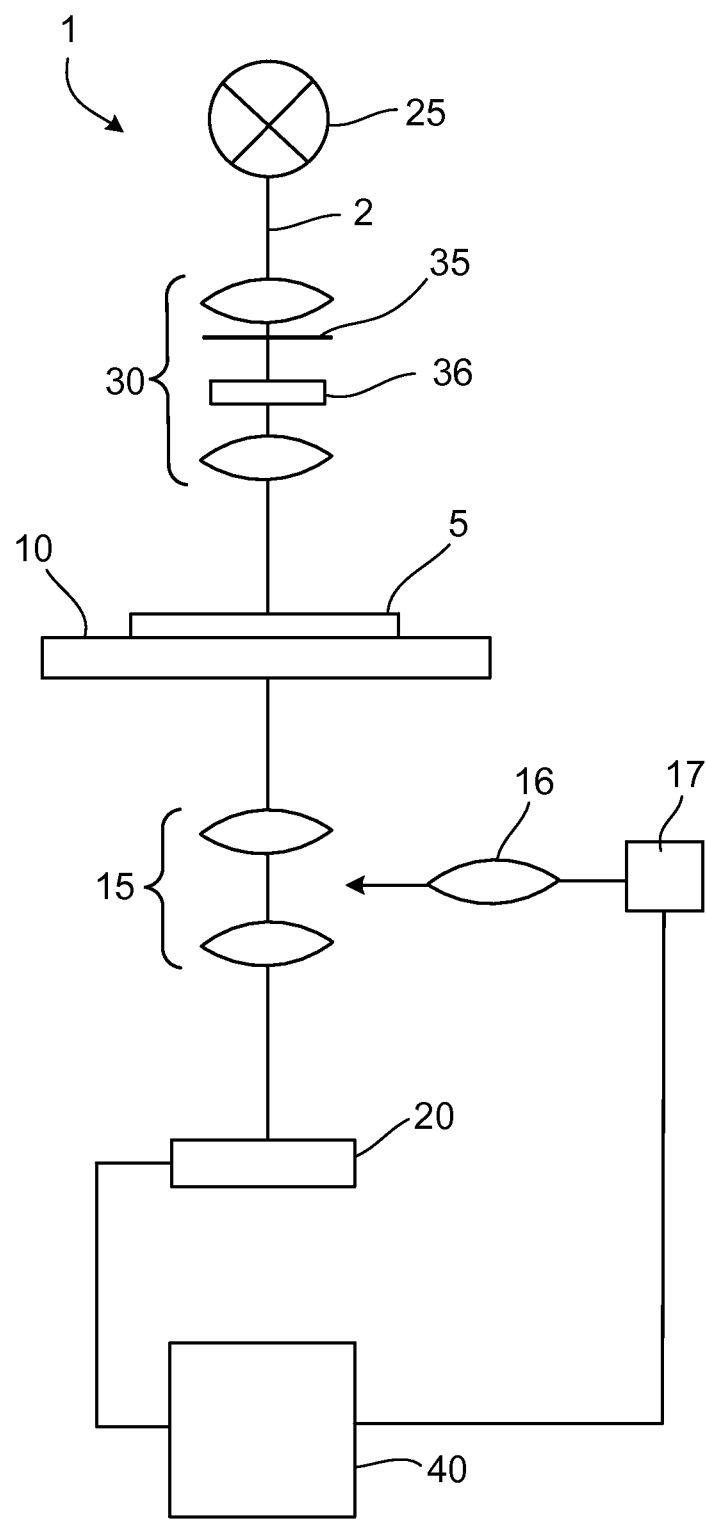
FIG. 1 is a diagram of the structure of an example microscope.

The method according to the invention is used, for example, to simulate aerial images generated by a microscope 1. An example of the structure of the microscope 1 is described with reference to FIG. 1. The microscope 1 comprises a sample holder 10, on which the object 5 to be imaged rests, and a detector 20 configured as a CCD (charge coupled device) chip. A light source 25 illuminates the object 5 via an illumination optic 30 having a pupil plane 35. Illumination settings can be set via a pupil filter, which is disposed in the pupil plane 35, and a polarizer 36. Illumination settings and polarization settings adjusted to the structure are used in capturing the aerial image of the object 5 by means of the detector 20.

An aerial image of the object 5 is generated in the plane of the detector 20 via the imaging optic 15 having optical axis 2.

To achieve focus, the imaging optic 15 is moved along the optical axis 2 in the direction perpendicular to the XY-plane, designated as the Z-direction. The aerial image is read by the processing unit 40, which is configured as a computer. The aerial image is initially present as a data structure in the random access memory of the computer. This can be stored as a graphics file on the computer's hard drive. The data structure or graphics file is a two-dimensional matrix composed of pixels. The intensities of the pixels are represented by numerical values from 0 to 255. The image area on the mask is square, with an edge length of 10 μm. The slice of the captured substructure is defined by the image area.

To capture an aerial image of the intensity distribution in the pupil plane 35 of the illumination optic 30, a Bertrand lens 16 is moved into the beam path of the microscope 1 by means of a drive 17 controlled by the processing unit 40. The aerial image is stored in the memory of the processing unit 40 as a first matrix having constant resolution.

Microscopes such as the described microscope 1 are used as a mask inspection microscope or as position measuring devices to inspect masks in lithography. The sample holder 10 is then configured as a mask holder or stage. The object 5 for inspection is, for example, a mask.

Aerial image simulation is performed by methods of the kind described in the article H. H. Hopkins, "On the diffraction theory of optical images, "Proceedings of the Royal Society of London, Series A, Mathematical and Physical Sciences 217/1130 (1953), pages 408-432.

One available option for simulating aerial images of masks is the program MicroSim. The simulation is performed on the basis of the feature specifications of the mask, the mask design. The MicroSim program is described, for example, in M. Totzeck, "Numerical simulation of high-NA quantitative polarization microscopy and corresponding near-fields," Optik 112 (2001), pages 381-390 (MicroSim software, University of Stuttgart). The imaging conditions of the microscope 1, such as, for example, numerical aperture, wavelength, polarization and degree of coherence of the illumination or illuminating radiation, etc., are taken into account during the simulation process.

The first data set represents the object. In simulating the aerial image of mask, this is, for example, the mask design.

The intensities of the aerial image to be simulated are represented as matrix $I_{MT}$, composed of n×m pixels. The second data set, the intensity distribution in the pupil plane, is represented as matrix $P_M$, composed of o×p pixels. With coherent illumination, the aerial images are given as $I_{MC}$ for each illumination direction $f_o$, $f_p$. The parameters $f_o$, $f_p$ are coordinates of the pupil plane or the spatial frequency spectrum, normalized to the illumination angle Θ and the wavelength λ of the illuminating radiation.

$$f_o = \frac{\sin\theta_o}{\lambda}, f_p = \frac{\sin\theta_p}{\lambda}$$

For each pixel having the coordinates $x_m$, $y_n$, the intensity $I_{MT}$ is calculated according to Equation 1:

$$I_{MT}(x_m, y_n) = \sum_{f_o'}\sum_{f_p'} I_{MC}(x_m, y_n, f_o, f_p) P_M(f_o, f_p) \quad \text{(Equ. 1)}$$

Different approximation methods can be used in simulation according to Equation 1. For example, if the mask design is known, the aerial image of the structure can be simulated using the Kirchhoff approximation. If the three-dimensional structure of an object is known, it is also possible to perform a rigorous simulation.

The calculation can be simplified if the pupil $P_M$ is symmetrical. If a plane of symmetry passes through the center of the pupil, the calculation according to Equation 1 need only be performed for one half of the pupil in each case.

Matrix $P_M$ in Equation 1 can be a first matrix having constant resolution $S_M$ or a second data set with varying resolution $R_M$. The resolution of matrix $R_M$ can vary according to location and/or intensity per unit area. In a variant of the method, the resolution can also be varied according to the intensity gradient. The matrix can be captured by the microscope 1 or specified from a file.

If the matrix $P_M$ is present as a first matrix having constant resolution $S_M$, the method described below can be used to define a matrix with variable resolution $R_M$, as explained with reference to FIG. 2. This method is also referred to as the "gridding" of $S_M$.

Figure 2:
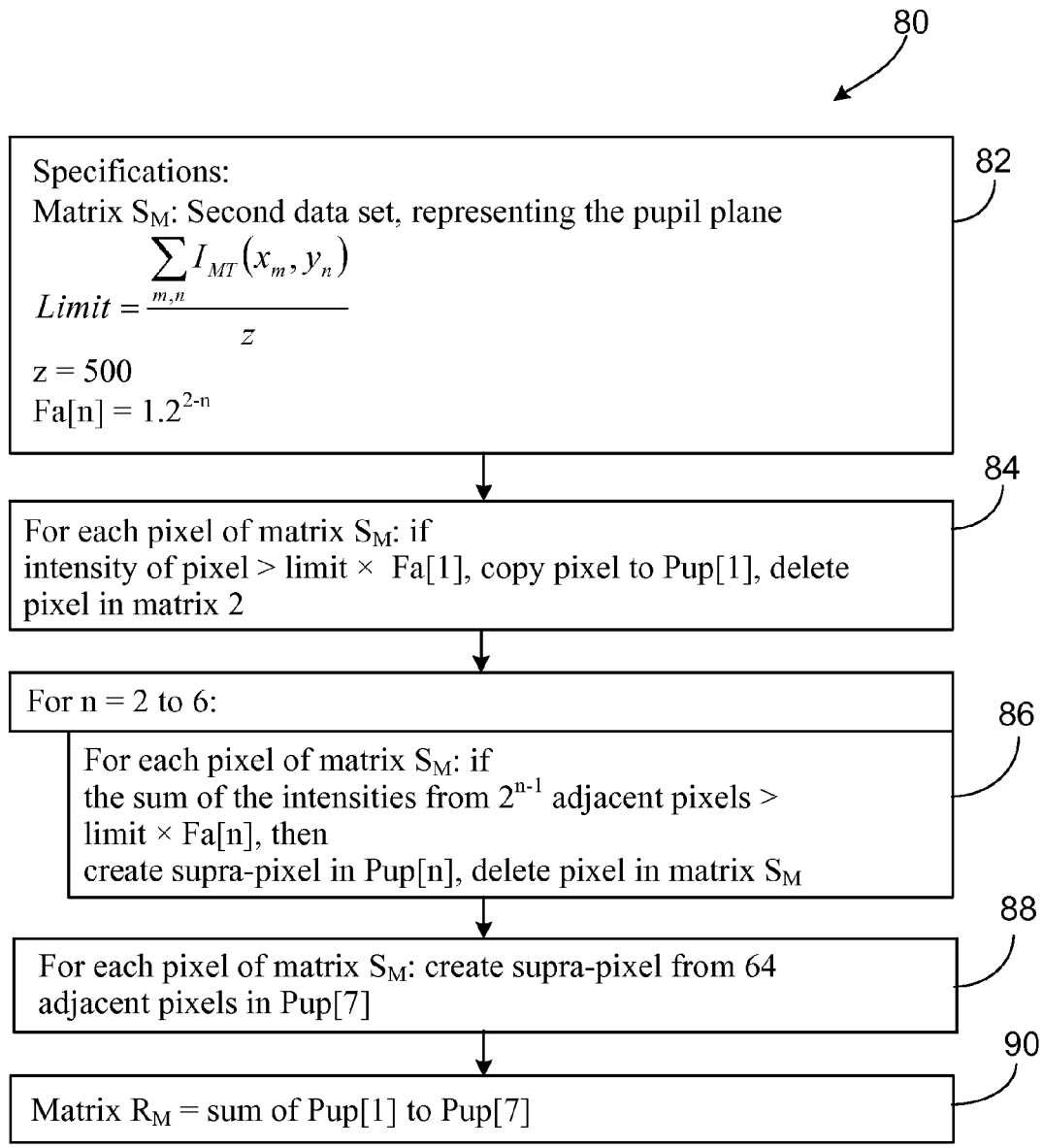
FIG. 2 is a diagram representing an example method for gridding a pupil plane.

Referring to FIG. 2, a process 80 for determining a matrix having a variable resolution includes the following. A threshold value limit for the intensities is specified 82, and factors Fa[1] to Fa[7] for iterative variation of the threshold value limit are determined. The higher the value of the limit, the smaller the number of superpixels in the gridded matrix $R_M$ and the resolution. A relatively small number of small superpixels are then formed. The lower the value of the limit, the higher the number of superpixels and the resolution. A relatively large number of small superpixels are then formed. To estimate the order of magnitude of the limit for a predefined number of superpixels, a value for the limit can be determined from Equation 2. The parameter z is the desired number of superpixels. Advantageous values for z are in the range of 200 to 800; particularly advantageous values are in the range of 400 to 600. The numerator of Equation 2 calculates the total intensity of the pupil plane.

$$\text{Limit} = \frac{\sum_{m,n} I_{MT}(x_m, y_n)}{z} \quad \text{Equation 2}$$

The factors Fa[n] assume, for n=1 to 7, the values Fa[1]=1.2; Fa[2]=1; Fa[3]=1/1.2; Fa[4]=1/(1.2²)≈1/1.4; Fa[5]=1/(1.2³)≈1/1.7; Fa[6]=1/(1.2⁴)≈½, that is, Fa[n]=1.2²⁻ⁿ. These are heuristic values. They can be adjusted according to the microscope or illumination settings used.

In a first step, pixels of $S_M$ are copied into an auxiliary matrix Pup[1] whose intensity is greater than the value "limit×Fa[1]." The intensities of these pixels are deleted in matrix $S_M$, meaning that the value of each of them is set to zero 84.

In each of the next five steps, 2, 4, 8, 16 or 32 pixels (generally formulated: $2^{n-1}$ pixels, where n is the number of steps) of matrix $S_M$ are combined into superpixels 86. This takes place under the condition that the sum of the intensities of the pixels to be combined is greater than the threshold value "limit×Fa[n]", where n is the iteration number and assumes values of 2 to 6. The superpixels formed in a step n are stored in an auxiliary matrix Pup[n].

Whenever a superpixel is formed, the intensities of the combined pixels are deleted in a starting matrix $S_M$. If complete pixels are combined, this means that the value of the intensity is set to zero in matrix $S_M$. In general, the value of the intensity of a pixel is subtracted. This is relevant when a superpixel extends over portions of pixels in matrix $S_M$. If two pixels are being combined, for example, one complete pixel and four fourths of four adjacent pixels can be combined. This is explained more precisely below with reference to FIG. 3. In matrix $S_M$, the particular intensities combined into superpixels are then subtracted from the intensity values of the original pixels. The intensity of the central pixel then becomes zero, and the intensities of the four adjacent pixels are each decreased by one-fourth. The remaining intensities are then taken into account in the next iterations as the process continues.

The intensities that still remain after the steps for n=2 to 6 are combined into superpixels composed of 64 pixels in the auxiliary matrix Pup[7] 88.

To complete the process, matrix $R_M$ is created by adding together auxiliary matrices Pup[1] to Pup[7] 90.

Once gridding has taken place, matrix $R_M$ is in the form of a matrix having the same resolution as matrix $S_M$. At the pixels of this matrix corresponding to the locations of the superpixels, the intensities of the superpixels are entered. The other pixels included in a superpixel are assigned the value zero. Using this matrix, the simulation of the aerial image can be performed with little computational effort, and thus quickly.

Matrix $R_M$ is now used, as matrix $P_M$, to simulate the aerial images according to Equation 1.

Figure 3:
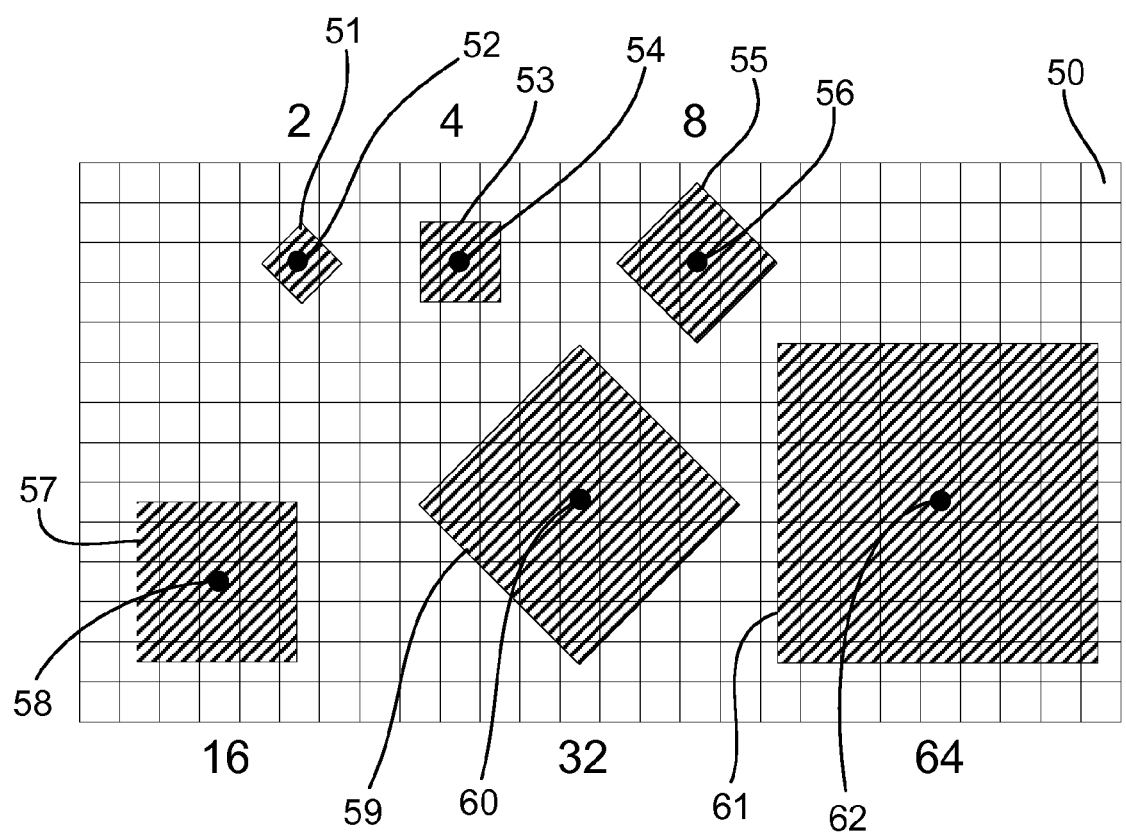
FIG. 3 is an illustration of examples of the combination of pixels into superpixels.
Figure 4:
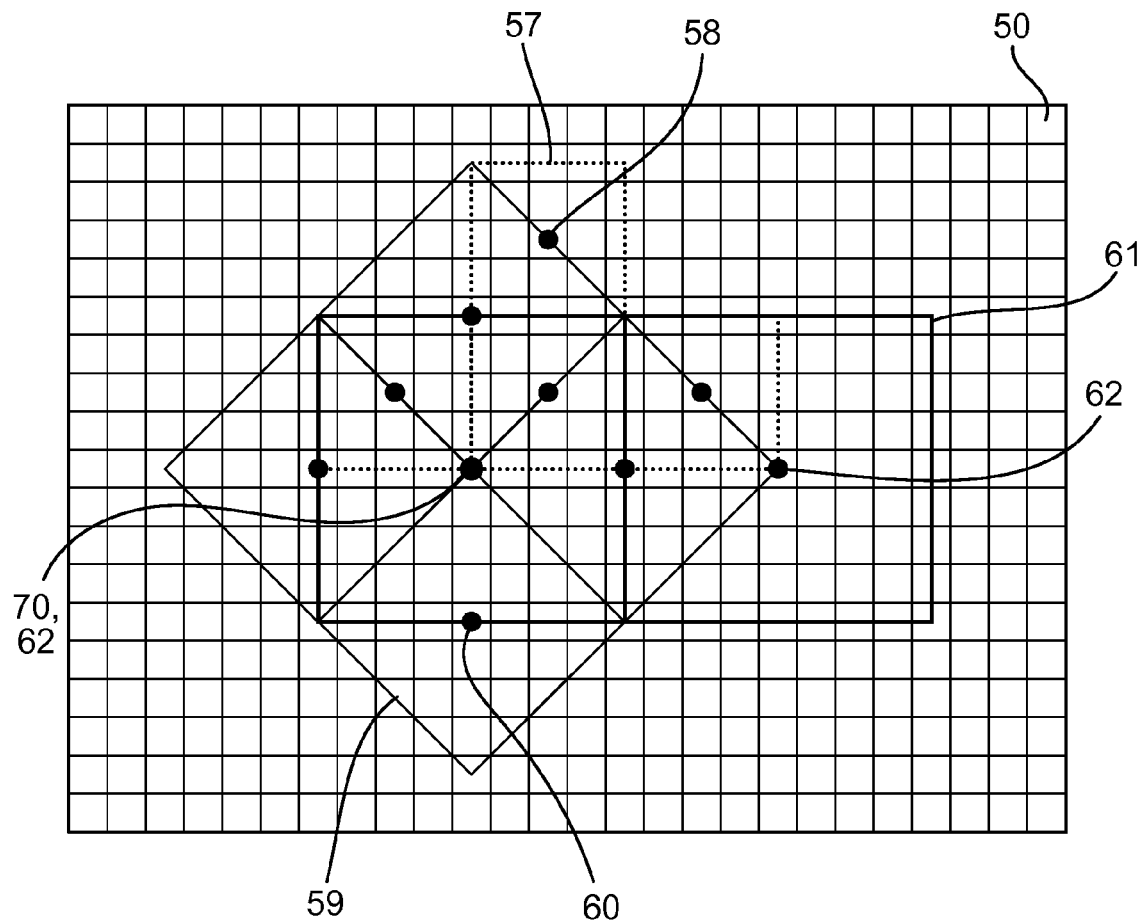
FIGS. 4 and 5 are illustrations of example arrangements of superpixels in the pupil plane.

As illustrated in FIGS. 3 and 4, the respective positions and shapes of the superpixels are selected to yield an arrangement that corresponds to the symmetry of the pupil.

FIG. 3 shows a grid of pixels 50 of matrix $S_M$. The superpixels 51, 53, 55, 57, 59, and 61 are illustrated with hatching. FIG. 3 illustrates how the superpixels are formed from single pixels. The superpixels 51, 53, 55, 57, 59, and 61 are configured as square, due to the symmetry of the conventional illumination settings, and the center 52, 54, 56, 58, and 60 of each coincides with the center of a respective pixel of the first matrix $S_M$. As a result, fractions of pixels are involved in the superpixels in the edge region. The corners are formed by fourths of pixels and the edge by half-pixels.

Superpixels 51, 55, 59, composed of 2, 8, 32 pixels, respectively, are rotated 45° with respect to the other superpixels. The edges of these pixels 51, 55, 59 run diagonally relative to the grid of the pixels 50. The edges of superpixels 53, 57, 61, composed of 4, 16, and 64 pixels, respectively, run parallel to the grid of the pixels 50. Symmetrical pixels are thereby obtained using the conventional illumination settings. No subpixels smaller than one-fourth of a pixel can be used in this process.

In a first variant, the location of a pixel is assumed to be its center. In a second variant, its centroid is calculated. This calculation is based on the intensities of the pixels of matrix $S_M$ from which the superpixel is formed. The location is then rounded to the center of a pixel of matrix $S_M$.

The pupil plane is divided into superpixels before the gridding is performed. This is illustrated in FIGS. 4 and 5.

FIG. 4 illustrates the following case: The center of a 64-pixel superpixel 61 coincides with the pupil center 70. The center 60 of a 32-pixel superpixel 59 lies on the center of the edge of a 64-pixel superpixel 61. The center 58 of a 16-pixel superpixel 57 lies on the center of the edge of a 32-pixel superpixel 59.

Figure 5:
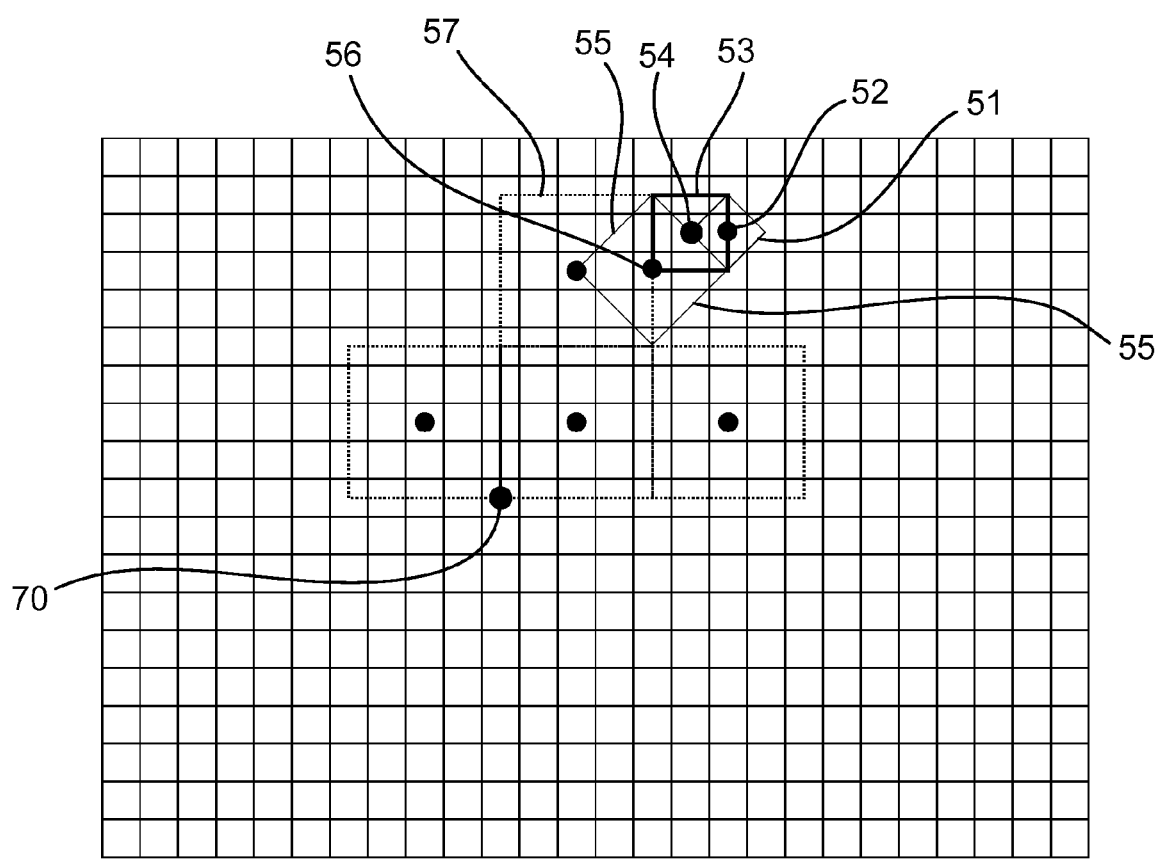

FIG. 5 illustrates the following case: The center 56 of an 8-pixel superpixel 55 lies on the center of the edge of a 16-pixel superpixel 57. The center 54 of a 4-pixel superpixel 53 lies on the center of the edge of an 8-pixel superpixel 55. The center 52 of a 2-pixel superpixel 51 lies on the center of the edge of a 4-pixel superpixel 53.

In a variant of the method, during the gridding, the threshold value limit is varied with a weighting function according to location on the pupil. This weighting causes the limit to decrease from the center 70 of the pupil radially to the edge. The value remains unchanged at the pupil center 70 and is decreased linearly to the edge by a factor of up to two.

The features described above related to processing of data, e.g., according to one or more of Equations 1 and 2, can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. For example, the processing unit 40 may include one or more such processors that execute instructions for implementing a process for simulating an aerial image. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a LCD (liquid crystal display) monitor, an electronic ink (E-ink) display, or an organic light emitting diode (OLED) display for displaying information to the user and a keyboard and a pointing device such as a mouse, a trackball, or touchpad by which the user can provide input to the computer. A touch display can also be used in which the display surface is sensitive to touch inputs from a user.

A number of implementations have been described. Nevertheless, it will be understood that various modifications may be made. For example, elements of one or more implementations may be combined, deleted, modified, or supplemented to form further implementations. As yet another example, the logic flows of processes described above do not require the particular order shown, or sequential order, to achieve desirable results. In addition, other steps may be provided, or steps may be eliminated, from the described flows, and other components may be added to, or removed from, the described systems. For example, the number of pixels in a superpixel can be different from those described above. The shapes of the superpixels can be different from those described above. Accordingly, other implementations are within the scope of the following claims.

What is claimed:

1. A method for simulating an aerial image generated by imaging an object with the use of an imaging optic, the object being illuminated by an illuminating optic by using a light source emitting illuminating radiation, the illuminating optic having a pupil plane, the method comprising:
    defining a first data set to represent the object;
    defining a second data set to represent the intensity distribution of the illuminating radiation in the pupil plane of said light source; and
    calculating the aerial image from the first and the second data set;
    wherein the resolution of the second data set varies according to the intensity or according to the location of the pupil plane,
    wherein the second data set is calculated from a first matrix of intensities having constant resolution by combining a plurality of adjacent pixels into superpixels according to their intensities or their locations, and
    wherein during the calculation of the second data set the resolution is increased from the center of the pupil to the edge.

2. The method of claim 1, wherein the second data set has a higher resolution in regions of high intensities than in regions of low intensities.

3. The method of claim 1, wherein the resolution of the second data set is higher in the outer region of the pupil than at its center.

4. The method of claim 1, wherein superpixels are formed iteratively, in which with each iteration the size of the superpixel to be formed increases and the intensity of the superpixel to be formed decreases.

5. The method of claim 1, wherein pixels whose intensities are greater than a predefined value are not combined into superpixels.

6. The method of claim 1, wherein the area of a superpixel is calculated from the sum of the areas of the combined pixels, in which the intensity of a superpixel is determined from the sum of the intensities of the combined pixels.

7. The method of claim 1, wherein the location of a superpixel is defined by calculating the center of the area or the centroid of the area based on the intensities of the combined pixels.

8. The method of claim 1, wherein the superpixels are disposed symmetrically to the center of the pupil plane of the light source.

9. The method of claim 1, wherein superpixels are formed from 2, 4, 8, 16, 32 or 64 pixels.

10. The method of claim 1, wherein the superpixels are shaped as square.

11. The method of claim 1, wherein the edges of at least some of the superpixels are disposed parallel to the pixels of the first matrix.

12. The method of claim 1, wherein the edges of at least some of the superpixels are disposed diagonal to the pixels of the first matrix.

13. A microscope comprising
    an imaging optic for imaging an object;
    a light source having a pupil plane;
    a detector for capturing an aerial image of the object;
    a processing unit for simulating aerial images generated by the microscope, the processing unit being configured to perform:
        defining a first data set to represent the object,
        defining a second data set to represent the intensity distribution of the illuminating radiation in the pupil plane of the light source, in which the second data set is calculated from a first matrix of intensities having constant resolution by combining a plurality of adjacent pixels into superpixels according to their intensities or their locations, and
        calculating the aerial image from the first and the second data sets;
    wherein the resolution of the second data set varies according to the intensity or according to the location of the pupil plane.

14. The microscope of claim 13, comprising a Bertrand lens to be moved into the beam path of the imaging optic to capture an aerial image of the pupil plane by using the detector, wherein the aerial image is provided as a first matrix of intensities having constant resolution.

15. The microscope of claim 13 in which superpixels are formed iteratively, and with each iteration the size of the superpixel to be formed increases and the intensity of the superpixel to be formed decreases.

16. The microscope of claim 13 in which the edges of at least some of the superpixels are disposed diagonal to the pixels of the first matrix.

17. An apparatus comprising
    a storage to store instructions; and
    a data processor to execute the instructions to implement a process for simulating an aerial image of an object generated by a microscope, the process comprising:
        defining a first data set to represent the object,
        defining a second data set to represent an intensity distribution of illuminating radiation in a pupil plane of a light source of the microscope, and
        calculating the aerial image from the first and the second data set;
    wherein the resolution of the second data set varies according to the intensity or according to the location in the pupil plane,
    wherein the second data set is calculated from a first matrix of intensities having constant resolution by combining a plurality of adjacent pixels into superpixels according to their intensities or their locations, and
    wherein the area of a superpixel is calculated from the sum of the areas of the combined pixels, in which the intensity of a superpixel is determined from the sum of the intensities of the combined pixels.

18. The apparatus of claim 17, wherein the second data set has a higher resolution in regions of high intensities than in regions of low intensities.

19. The apparatus of claim 17, wherein the resolution of the second data set is higher in the outer region of the pupil than at its center.

20. The apparatus of claim 17, wherein superpixels are formed iteratively, in which with each iteration the size of the superpixel to be formed increases and the intensity of the superpixel to be formed decreases.

21. The apparatus of claim 17, wherein pixels whose intensities are greater than a predefined value are not combined into superpixels.

22. The apparatus of claim 17, wherein the location of a superpixel is defined by calculating the center of the area or the centroid of the area based on the intensities of the combined pixels.

23. The apparatus of claim 17, wherein the superpixels are disposed symmetrically to the center of the pupil plane of the light source.

24. The apparatus of claim 17, wherein superpixels are formed from 2, 4, 8, 16, 32 or 64 pixels.

25. The apparatus of claim 17, wherein the superpixels are shaped as square.

26. The apparatus of claim 17, wherein the edges of at least some of the superpixels are disposed parallel to the pixels of the first matrix.

27. The apparatus of claim 17, wherein the edges of at least some of the superpixels are disposed diagonal to the pixels of the first matrix.

28. A method for simulating an aerial image generated by imaging an object with the use of an imaging optic, the object being illuminated by an illuminating optic by using a light source emitting illuminating radiation, the illuminating optic having a pupil plane, the method comprising:

defining a first data set to represent the object;

defining a second data set to represent the intensity distribution of the illuminating radiation in the pupil plane of said light source; and calculating the aerial image from the first and the second data set;

wherein the resolution of the second data set varies according to the intensity or according to the location of the pupil plane, wherein the second data set is calculated from a first matrix of intensities having constant resolution by combining a plurality of adjacent pixels into superpixels according to their intensities or their locations, and wherein pixels whose intensities are greater than a predefined value are not combined into superpixels.

29. The method of claim 28, wherein the second data set has a higher resolution in regions of high intensities than in regions of low intensities.

30. The method of claim 28, wherein the resolution of the second data set is higher in the outer region of the pupil than at its center.

31. The method of claim 28, wherein superpixels are formed iteratively, in which with each iteration the size of the superpixel to be formed increases and the intensity of the superpixel to be formed decreases.

32. The method of claim 28, wherein the area of a superpixel is calculated from the sum of the areas of the combined pixels, in which the intensity of a superpixel is determined from the sum of the intensities of the combined pixels.

33. The method of claim 28, wherein the location of a superpixel is defined by calculating the center of the area or the centroid of the area based on the intensities of the combined pixels.

34. The method of claim 28, wherein the superpixels are disposed symmetrically to the center of the pupil plane of the light source.

35. The method of claim 28, wherein superpixels are formed from 2, 4, 8, 16, 32 or 64 pixels.

36. The method of claim 28, wherein the superpixels are shaped as square.

37. The method of claim 28, wherein the edges of at least some of the superpixels are disposed parallel to the pixels of the first matrix.

38. The method of claim 28, wherein the edges of at least some of the superpixels are disposed diagonal to the pixels of the first matrix.

* * * * *